(12) United States Patent
Takeuchi et al.

(10) Patent No.: US 7,528,417 B2
(45) Date of Patent: May 5, 2009

(54) LIGHT-EMITTING DIODE DEVICE AND PRODUCTION METHOD THEREOF

(75) Inventors: Ryouichi Takeuchi, Chichibu (JP); Keiichi Matsuzawa, Chichibu (JP); Junichi Yamazaki, Chichibu (JP)

(73) Assignee: Showa Denko K.K., Tokyo (JP)

( * ) Notice: Subject to any disclaimer, the term of this patent is extended or adjusted under 35 U.S.C. 154(b) by 25 days.

(21) Appl. No.: 10/544,940

(22) PCT Filed: Feb. 9, 2004

(86) PCT No.: PCT/JP2004/001338

§ 371 (c)(1),
(2), (4) Date: Jan. 13, 2006

(87) PCT Pub. No.: WO2004/070851

PCT Pub. Date: Aug. 19, 2004

(65) Prior Publication Data

US 2006/0163603 A1 Jul. 27, 2006

Related U.S. Application Data

(60) Provisional application No. 60/448,104, filed on Feb. 20, 2003, provisional application No. 60/456,561, filed on Mar. 24, 2003.

(30) Foreign Application Priority Data

Feb. 10, 2003 (JP) .............................. 2003-032580
Mar. 12, 2003 (JP) .............................. 2003-067362

(51) Int. Cl.
*H01L 21/00* (2006.01)
(52) U.S. Cl. .......................... 257/96; 257/94; 257/97; 438/46; 438/478
(58) Field of Classification Search .................. 257/94, 257/96, 97; 438/46, 478
See application file for complete search history.

(56) References Cited

U.S. PATENT DOCUMENTS 3,312,570 A 4/1967 Ruehrwein
(Continued)

FOREIGN PATENT DOCUMENTS

DE 197 56 856 A1 7/1998
(Continued)

OTHER PUBLICATIONS

Jyh-Feng Lin, et al.; "Growth of a GaP Window Layer on AlGaInP Light-Emitting Diodes Using Misoriented Substrates"; Journal of Crystal Growth 142 (1994), pp. 15-20.
G.B. Stringfellow, et al.; "High Brightness Light Emitting Diodes"; Semiconductors and Semimetals, vol. 48, 1996; pp. 106, 162 and 168.

*Primary Examiner*—Steven Loke
*Assistant Examiner*—David Goodwin
(74) *Attorney, Agent, or Firm*—Sughrue Mion, PLLC

(57) ABSTRACT

A double hetero structure light-emitting diode device includes an active layer (6), a positive-electrode-side cladding layer, a negative-electrode-side cladding layer (4), a window layer (9) and an undoped AlInP layer. The positive-electrode-side cladding layer includes an undoped AlInP layer (7) grown to have a thickness of 0.5 μm and an intermediate layer (8) doped to assume p-type conductivity and having an intermediate energy band gap value between that of the undoped AlInP layer and that of the window layer. The window layer on the intermediate layer is a GaP layer grown at 730° C. or higher and at a growth rate of 7.8 μm/hour or more in the presence of Ze serving as a dopant. The negative-electrode-side cladding layer is provided with an undoped AlInP layer (5) having a thickness of 0.1 μm or more. With this configuration, there is provided a light-emitting diode device that enhances the crystallinity of a window layer, prevents generation of faults caused by a high-temperature process and attains high luminance at a wavelength falling within a yellow-green band.

36 Claims, 11 Drawing Sheets

U.S. PATENT DOCUMENTS

| | | | |
|---|---|---|---|
| 5,008,718 A | | 4/1991 | Fletcher et al. |
| 5,270,246 A | * | 12/1993 | Mannou et al. ............... 438/43 |
| 5,656,829 A | * | 8/1997 | Sakaguchi et al. ............ 257/94 |
| 5,789,768 A | * | 8/1998 | Lee et al. ..................... 257/96 |
| 5,856,682 A | | 1/1999 | Sasaki |
| 6,081,540 A | | 6/2000 | Nakatsu |
| 6,165,809 A | | 12/2000 | Kurahashi |
| 6,468,818 B2 | | 10/2002 | Nakamura et al. |
| 6,469,324 B1 | * | 10/2002 | Wang ......................... 257/98 |
| 6,512,248 B1 | | 1/2003 | Takeuchi et al. |
| 6,525,335 B1 | * | 2/2003 | Krames et al. ................ 257/13 |
| 6,542,528 B1 | * | 4/2003 | Sato et al. ............... 372/45.01 |
| 6,608,328 B2 | * | 8/2003 | Kuo et al. .................... 257/79 |
| 6,787,383 B2 | * | 9/2004 | Ikeda et al. .................. 438/44 |
| 6,884,291 B1 | * | 4/2005 | Jikutani et al. ............... 117/89 |
| 7,087,941 B2 | | 8/2006 | Gardner et al. |
| 2001/0004114 A1 | * | 6/2001 | Yuri ........................... 257/94 |
| 2002/0000563 A1 | * | 1/2002 | Udagawa ..................... 257/94 |
| 2002/0145146 A1 | | 10/2002 | Shibata et al. |
| 2004/0224434 A1 | * | 11/2004 | Shibata et al. ............... 438/46 |

FOREIGN PATENT DOCUMENTS

| | | |
|---|---|---|
| DE | 199 11 701 A1 | 2/2000 |
| DE | 100 20 612 A1 | 11/2000 |
| EP | 4 34 233 A1 | 6/1991 |
| JP | 3-270186 | 12/1991 |
| JP | 3-270186 A | 12/1991 |
| JP | 7-106698 A | 4/1995 |
| JP | 8-18102 | 1/1996 |
| JP | 8-18102 A | 1/1996 |
| JP | 8-83927 | 3/1996 |
| JP | 8-293623 | 11/1996 |
| JP | 8-293623 A | 11/1996 |
| JP | 8-321633 | 12/1996 |
| JP | 8-321633 A | 12/1996 |
| JP | 9-186360 | 7/1997 |
| JP | 9-260724 | 10/1997 |
| JP | 9-260724 A | 10/1997 |
| JP | 11-017220 | 1/1999 |
| JP | 11-233820 | 8/1999 |
| JP | 11-330543 A | 11/1999 |
| JP | 2000-312030 | 11/2000 |
| JP | 2000-312030 A | 11/2000 |
| JP | 2001-24285 | 1/2001 |
| JP | 2001-189493 | 7/2001 |
| JP | 2002-43621 | 2/2002 |
| JP | 2002-84001 | 3/2002 |
| JP | 2002-329889 | 11/2002 |
| JP | 2003-8058 | 1/2003 |
| JP | 2003-243698 A | 8/2003 |

* cited by examiner

F I G. 3(a)
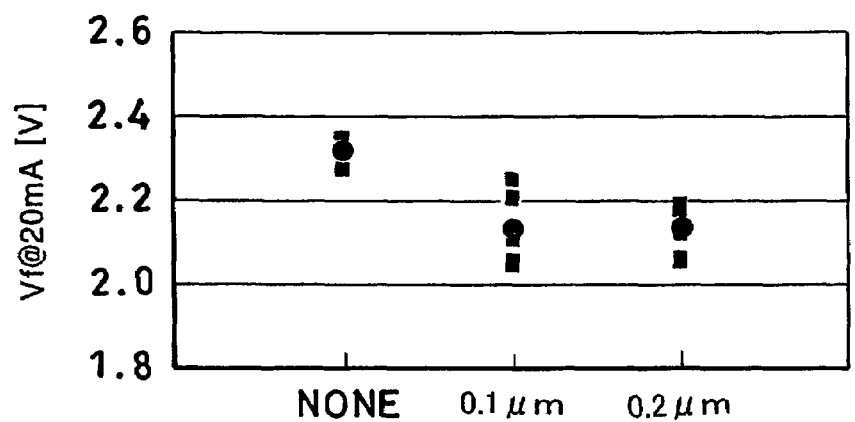
F I G. 3(b)
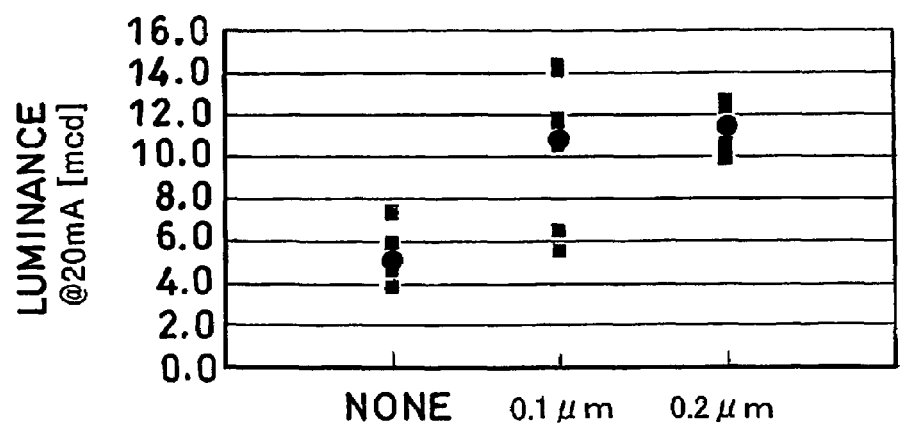

F I G. 9
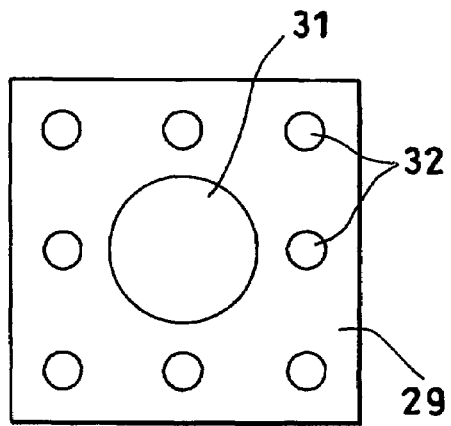
F I G. 10
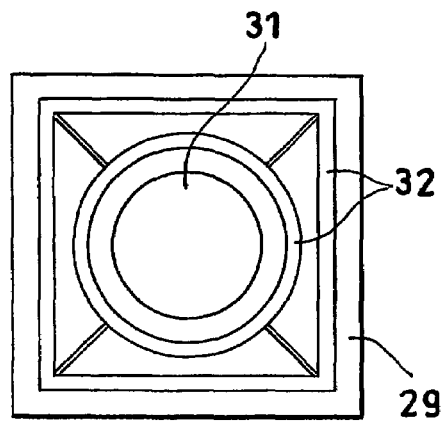
F I G. 11
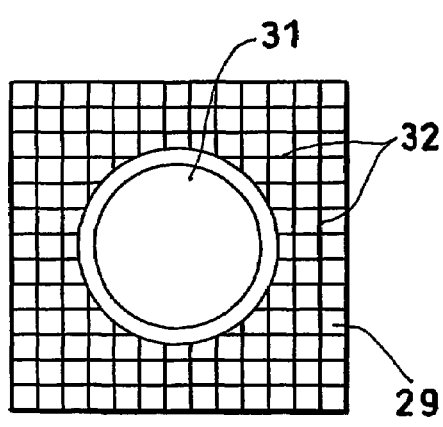
F I G. 12
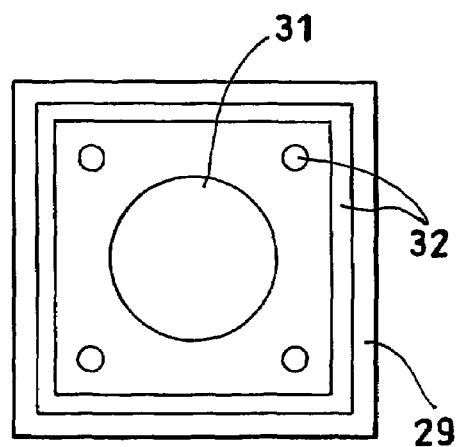

LIGHT-EMITTING DIODE DEVICE AND PRODUCTION METHOD THEREOF

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application Ser. No. 60/448,104 filed Feb. 20, 2003 and Provisional Application Ser. No. 60/456,561 filed Mar. 24, 2003 pursuant to 35 U.S.C. §111 (b).

TECHNICAL FIELD

The present invention relates to a light-emitting diode (LED) device emitting visible light and to a method for producing the LED device

BACKGROUND ART

LEDs find a variety of uses including display devices. As is well known, the emission wavelength of LEDs employing a semiconductor depends on the type of the semiconductor and increases in the order of InGaN, AlGaInP, GaAlAs and GaInAsP. Year by year, the luminance of LEDs has been improved, and a high-luminance LED is now employed as an illuminator or a backlight of liquid crystal display devices. However, studies on further improvement of the luminance are underway.

Among such LEDs of high emission efficiency, U.S. Pat. No. 5,008,718 and JP-A HEI 3-270186 disclose LEDs having a double hetero (DH) junction structure as shown in FIG. 14 or 15. One characteristic feature of these LEDs is a structure in which an active layer 102 for emitting light through recombination of electrons and holes is sandwiched by confinement layers 103 and 104 for confining electrons and holes in the active layer 102. The confinement layers, having a band gap wider than that of the active layer, serve as cladding layers that do not absorb emitted light. Further, reference numeral 101 denotes a substrate, 105 a window layer, 106 a backside electrode, 107 a front side electrode, and 107 an n-type block layer.

As is well known, the wavelength of the light that is emitted from an LED having the aforementioned structure is determined by the composition of the active layer. For example, in an LED employing an active layer 102 formed of AlGaInP (e.g., $(Al_xGa_{1-x})_{0.5}In_{0.5}P$) having a double hetero (DH) junction structure as shown in FIG. 16, the band gap energy (Eg) of the active layer varies in accordance with the value of x; i.e., in accordance with the equation: Eg=1.91+0.61x (eV) ($0 \leq x \leq 0.6$). Therefore, the wavelength of the light emitted from the LED varies from 650 nm to 545 nm in accordance with the band gap energy of the active layer; i.e., the composition of the active layer. As is also known, when the value of x is increased, the wavelength of the light emitted from the LED is shortened and the intensity of the light decreases considerably.

The reason for the decrease in emitted light intensity has been elucidated as follows. The compositional proportion of gallium (Ga) in the active layer is reduced, since the band gap of the active layer is required to increase for emitting short-wavelength light. However, the band gap difference between the active layer and a confinement layer decreases with a decrease in the compositional proportion. Thus, the potential barrier increases upon injection of holes into the active layer, thereby decreasing the hole-injection efficiency. In addition, the barrier level of the cladding layer with respect to the electrons confined in the active layer decreases, leading to poor electron confinement. As a result, occurrence of recombination of electrons and holes becomes less frequent, thereby lowering emission light output.

In this connection, "High Brightness Light Emitting Diode" (pp. 106, 162 and 168(1996), G. B. Stringfellow et al.) describes that forming a cladding layer from AlInP improves the hole injection efficiency and electron confinement effect of an LED.

JP-A HEI 8-321633 discloses an LED in which a portion of the p-type cladding layer that is in contact with the active layer is formed from an undoped layer having a thickness of about 0.005 to about 0.2 μm.

JP-C 3233569 discloses a configuration in which an additional layer is inserted between a p-GaP window layer and a p-AlGaInP layer or between a p-AlGaInP cladding layer and an AlGaInP active layer so as to prevent notches generated as a result of band discontinuity, wherein the additional layer has an intermediate band gap value falling between the band gap values of the layers sandwiching the additional layer, thereby reducing resistance to forward current.

JP-C 3024484 discloses an LED device having a characteristic cladding layer structure. As shown in FIG. 17, the device includes an active layer 102, an n-type cladding layer 103 disposed on the lower side of the active layer and a p-type cladding layer 104 disposed on the upper side of the active layer. The n-type cladding layer 103 includes a first n-type cladding layer 103a adjacent to the active layer and a second n-type cladding layer 103b adjacent to the first cladding layer. The p-type cladding layer 104 includes a first p-type cladding layer 104a adjacent to the active layer and a second p-type cladding layer 104b adjacent to the first p-type cladding layer 104a. The first cladding layer has a carrier concentration lower than that of the second cladding layer and has a thickness smaller than that of the second n-type cladding layer and greater than a thickness for exerting a quantum mechanical tunnel effect. The potential barrier height provided in a valence band between the active layer and the second cladding layer is predetermined at a level higher than the potential barrier height provided in a valence band between the active layer and the first cladding layer. The first and second cladding layers are formed of AlGaInP, and the ratio of In to AlGa in the first cladding layer is predetermined at a level lower than the ratio of In to AlGa in the second cladding layer. Further, reference numeral 109 denotes a buffer layer.

JP-A 2000-312030 discloses another LED device. As shown in FIG. 18, the device has a stacked structure and electrodes attached to the stacked structure. The stacked structure includes an n-type cladding layer 103 formed of an AlGaInP-based compound semiconductor, an active layer 102 formed of an AlGaInP-based compound semiconductor having a composition for attaining a band gap energy lower than that of the n-type cladding layer, a cladding layer 104 formed of a p-type AlGaInP-based compound semiconductor having a composition for attaining a band gap energy higher than that of the active layer, and a p-type window layer 105 formed of GaP. The device further includes, between the p-type cladding layer 104 and the p-type window layer 105, a mediation layer (forward voltage reduction layer) 110 formed of a material having band-gap energy lower than that of the p-type cladding layer.

JP-A HEI 8-293623 discloses a method for producing an LED device having a DH junction structure. As shown in FIG. 19, the device has a DH junction light-emitting layer including, on a semiconductor substrate 101, an n-type cladding layer 103, an active layer 102 and a p-type cladding layer 104 such that excellent characteristics can be attained without inducing low light emission efficiency caused by diffusion of p-type impurities to the non-doped active layer. The method includes sequential formation of the semiconductor layers, with a portion of the p-type cladding layer 104 on the side of the active layer 102 being virtually formed of a non-doped layer 111, and formation of an electrode 107 through a contact layer 113 on a current diffusion layer (window layer) 105.

U.S. Pat. No. 5,008,718 also discloses an LED device of a structure having a GaP window layer provided on the AlGaInP layer. "J. Crys. Growth" (142, pp. 15-20 (1994), J. Lin et al.) discloses a method for producing an LED device as shown in FIG. 20 including a step of stacking the GaP window layer 105 on the AlGaInP layer, wherein the growth is performed at 800° C. or higher so as to prevent generation of crystal faults.

Generally, p-AlGaInP or p-AlInP is known to have a very small electric conductivity. In order to overcome such a small conductivity, a window layer (or a current diffusion layer) is employed in an LED device so as to increase the area of a light-emitting portion such that current is diffused without flowing locally. However, when the window layer has a large resistivity, the voltage required for supplying rating current to the LED device increases. Thus, the window layer is preferably formed from a substance having as small a resistivity as possible.

Enhancing the crystallinity of the window layer (or current diffusion layer) is effective for lowering the specific resistance of the window layer. However, when the window layer is grown at high temperature in order to enhance crystallinity of the layer, the entirety of the LED device undergoes a high-temperature process. Thus, problems occur in a portion of the device other than the window layer, resulting in a failure to produce an LED device of high output intensity.

Conventionally known light-emitting devices which emit light assuming a color ranging from yellowish green to reddish orange (e.g., light-emitting diodes (LEDs) and laser diodes (LDs)) include a light-emitting device incorporating a light-emitting section formed of an AlGaInP mixed crystal layer, as disclosed in JP-A HEI 8-83927, for example.

The light-emitting device disclosed in JP-A HEI 8-83927 has a configuration including a light-emitting section formed of an AlGaInP mixed crystal layer, a transparent, electrically conductive film formed of indium tin oxide which is laminated on the surface of the light-emitting section, and an upper surface electrode formed on the transparent, electrically conductive film. In the light-emitting device having this configuration, current from the upper surface electrode is caused to diffuse, via the transparent, electrically conductive film, to the largest possible area on the surface of the semiconductor.

However, in the aforementioned conventional light-emitting device, sufficient ohmic contact between the transparent, electrically conductive film and the surface of the light-emitting section fails to be attained, leading to an increase in forward voltage and deterioration of lifetime characteristics. In view of the foregoing, for example, JP-A HEI 11-17220 discloses a light-emitting device exhibiting improved ohmic contact.

The light-emitting device disclosed in JP-A HEI 11-17220 has a configuration including a light-emitting section, a window layer formed on the surface of the light-emitting section, a contact layer formed on the window layer, a transparent, electrically conductive film formed of indium tin oxide (electrically conductive, translucent oxide layer) which is laminated on the contact layer, and an upper surface electrode (upper layer electrode) formed on the transparent, electrically conductive film. In the light-emitting device, current from the upper surface electrode is caused to diffuse, via the transparent, electrically conductive film, contact layer and window layer, to the largest possible area on the surface of the light-emitting section.

In the light-emitting device disclosed in JP-A HEI 11-17220, although ohmic contact between the transparent, electrically conductive film and the semiconductor layer is improved, emitted light is absorbed in the contact layer provided on the light-emitting section, and therefore, high-luminance emission fails to be obtained, and emission efficiency is not improved.

In view of the foregoing, the present inventors have proposed a light-emitting device having a configuration including a semiconductor layer and distribution electrodes provided on a portion of the surface of the semiconductor layer. By virtue of this configuration, the electrical resistance between the distribution electrodes and the semiconductor layer becomes lower than that between a transparent, electrically conductive film and the semiconductor layer, and most of driving current supplied from a pad electrode flows, through a path exhibiting lower electrical resistance, successively to the transparent, electrically conductive film, distribution electrodes, and semiconductor layer (light-emitting section). This light-emitting device is disclosed in JP-A 2001-189493.

In the light-emitting device disclosed in JP-A 2001-189493, since light is emitted from portions of the light-emitting section, which portions correspond to portions located around the distribution electrodes, emission of light does not occur in a region directly below the distribution electrode. Therefore, most of the emitted light is not intercepted by the distribution electrode and can be extracted from the upper portion of the light-emitting device, whereby emission efficiency can be improved. Furthermore, the light-emitting device includes no contact layer, and thus the emitted light can be prevented from being absorbed in a contact layer. This prevention of light absorption also contributes to improvement of emission efficiency.

However, in the case of the light-emitting device disclosed in JP-A 2001-189493, although the distribution electrodes are dispersed and have a small area, light emitted in a region directly below each of the electrodes, is intercepted by the electrode when being extracted from the upper portion of the light-emitting device. This interception has been found to be a cause of lowering of emission efficiency.

In view of the foregoing, the present invention contemplates the provision of a light-emitting diode device capable of attaining high luminance at a wavelength falling within a yellow-green band, in which conventional devices have exhibited considerably decreased output intensity, wherein the device is produced by forming a window layer at a process temperature higher than that conventionally employed, thereby providing a window layer having improved electric-conductivity, and by modifying the device structure so as to prevent variation caused by a high-temperature process.

Other objects of the present invention are to provide a light-emitting diode device that enables attainment of good ohmic contact between an electrode and a semiconductor layer, and effective extraction of light emitted from a light-emitting section while preventing interception of the emitted light, whereby emission efficiency is improved, and to provide a method for producing the light-emitting diode device.

DISCLOSURE OF THE INVENTION

To obtain a light-emitting diode device with enhanced precision that enhances crystallinity of a window layer and prevents generation of faults caused by a high-temperature process, a light-emitting diode device of the present invention comprises an AlGaInP active layer, a positive-electrode-side cladding layer and a negative-electrode-side cladding layer which sandwich the active layer and have an energy band gap value greater than an energy band gap value of the active layer, and a window layer which is formed on the positive-electrode-side cladding layer and has an energy band gap value greater than that of the active layer, wherein the positive-electrode-side cladding layer comprises an undoped AlInP layer grown to have a thickness of 0.5 µm or more and kept in contact with the active layer, and an intermediate layer doped to assume p-type conductivity, kept in contact with the window layer and having an intermediate energy band gap value between an energy band gap value of the undoped AlInP layer and that of the window layer.

The present invention also provides a light-emitting diode device comprising an AlGaInP active layer, a positive-electrode-side cladding layer and a negative-electrode-side cladding layer which sandwich the active layer and have an energy band gap value greater than an energy band gap value of the active layer, and a window layer which is formed on the positive-electrode-side cladding layer and has an energy band gap value greater than that of the active layer, wherein the window layer is a GaP layer grown at 730° C. or higher and at a growth rate of 7.8 µm/hour or more in the presence of Zn serving as a dopant.

In the light-emitting diode device just mentioned above, the positive-electrode-side cladding layer comprises an undoped AlInP layer grown to have a thickness of 0.5 µm or more and kept in contact with the active layer, and an intermediate layer doped to assume p-type conductivity, kept in contact with the window layer and having an intermediate energy band gap value between an energy band gap value of the undoped AlInP layer and that of the window layer.

The present invention also provides a light-emitting diode device comprising an AlGaInP active layer, a positive-electrode-side cladding layer and a negative-electrode-side cladding layer which sandwich the active layer and have an energy band gap value greater than an energy band gap value of the active layer, and a window layer which is formed on the positive-electrode-side cladding layer and has an energy band gap value greater than that of the active layer, wherein the negative-electrode-side cladding layer comprises an undoped AlInP layer kept in contact with the active layer and having a thickness of 0.1 µm or more.

In the light-emitting diode device just mentioned above, the negative-electrode-side cladding layer comprises an n-type cladding layer kept in contact with a negative-electrode side of the undoped AlInP layer and containing silicon serving as a dopant.

The present invention further provides a method for producing a light-emitting diode device comprising the steps of depositing a buffer layer on a gallium arsenide (GaAs) substrate, providing an n-type reflection layer on the buffer layer, depositing a silicon-doped n-type cladding layer on the reflection layer, providing a first undoped AlInP layer on the n-type cladding layer, providing an AlGaInP active layer on the first undoped AlInP layer, providing a second undoped AlInP layer on the active layer, providing a p-type intermediate layer on the second undoped AlInP layer and growing on the p-type intermediate layer a zinc-doped p-type GaP layer serving as a window layer, at 730° C. or higher and at a growth rate of 7.8 µm/hour or more.

Furthermore, in order to obtain a light-emitting diode device exhibiting good ohmic contact between an electrode and a semiconductor layer and high emission efficiency, a light-emitting diode device of the present invention comprises a semiconductor substrate having on its rear surface a first electrode, a semiconductor layer formed on the semiconductor substrate and including a light-emitting section formed of AlInGaP and a window layer formed atop the light-emitting section, a distribution electrode formed to extend along a portion of a surface of the window layer and kept in ohmic contact with the window layer, a transparent, electrically conductive film formed to cover the surface of the window layer and the distribution electrode and establishing electrical conduction with the distribution electrode, and a pad electrode formed on a portion of a surface of the transparent, electrically conductive film and establishing electrical conduction with the electrically conductive film.

In the light-emitting diode device just mentioned above, the semiconductor substrate is of n-type conductivity, and the window layer is formed of a p-type GaP layer containing Zn or Mg as an impurity.

The window layer includes window layers having a thickness of at least 3 µm, having the thickness and a carrier concentration, a product N.d of which is at least $5 \times 10^{14}$ cm$^{-2}$ and having a surface carrier concentration of at least $1 \times 10^{18}$ cm$^{-3}$.

The distribution electrode of the light-emitting diode device is formed on a surface of the semiconductor layer so as not to overlap with the pad electrode when viewed from above, is smaller in area than the pad electrode, has a total surface area accounting for 3% or more, but 30% or less, of an effective emission area and is formed of a gold alloy.

The transparent, electrically conductive film of the light-emitting diode device is formed of indium tin oxide (ITO).

The pad electrode of the light-emitting diode device is formed on a center of a surface of the device when viewed from above, has a surface formed of gold, is formed of a multi-layer film that has a layer in contact with the transparent, electrically conductive film, formed of chromium.

The distribution electrode of the light-emitting diode device is formed of a loop electrode having a substantially quadrangular or substantially circular shape to surround the pad electrode and having a width of 20 µm or less.

The present invention further provides a method for producing a light-emitting diode device comprising the steps of epitaxially growing on a single-crystal substrate a semiconductor layer including a light-emitting section formed of AlInGaP and a p-type window layer atop the light-emitting section, forming a distribution electrode on a portion of a surface of the window layer and in ohmic contact with the window layer, forming a transparent, electrically conductive film to cover the surface of the window layer and the distribution electrode and establish electrical conduction with the distribution electrode, and forming a pad electrode on a portion of a surface of the transparent, electrically conductive film to establish electrical conduction with the electrically conductive film.

In the method just mentioned above, the semiconductor layer is formed through metal-organic chemical vapor deposition (MOCVD), the transparent, electrically conductive film is formed through sputtering, and the pad electrode is formed through sputtering.

The present invention further provides a light-emitting diode device with enhanced precision that enhances crystallinity of a window layer, prevents generation of faults and has a distribution electrode provided in the window layer.

In the DH-structure light-emitting diode device of the present invention having an AlGaInP active layer, as described above, the positive-electrode-side cladding layer comprises an undoped AlInP layer grown to have a thickness of 0.5 μm or more and in contact with the active layer, and an intermediate layer doped to assume p-type conductivity, in contact with the window layer and having an intermediate energy band gap value falling between the energy band gap value of the undoped AlInP layer and that of the window layer. Thus, the crystallinity of the window layer can be improved, and the luminance can be approximately doubled.

Also, in the light-emitting diode device of the present invention provided with a distribution electrode that is in ohmic contact with a portion of the surface of the window layer, since the electrical resistance between the distribution electrode and the window layer becomes considerably low and the current which has flowed from the distribution electrode to the window layer is appropriately diffused in the window layer, light is emitted from a portion located around the distribution electrode. Therefore, most of the emitted light is not intercepted by the distribution electrode and can be extracted from the upper portion of the light-emitting diode device.

BRIEF DESCRIPTION OF THE DRAWINGS

FIG. 2($b$) is a diagram showing dependency of the LED luminance on the composition of the intermediate layer included in the LED device of FIG. 1.

FIG. 3($a$) is a diagram showing dependency of the LED Vf on the thickness of a negative-electrode-side undoped AlInP layer included in the LED device of FIG. 1.

FIG. 3($b$) is a diagram showing dependency of the LED luminance on the thickness of the negative-electrode-side undoped AlInP layer included in the LED device of FIG. 1.

FIG. 4($b$) is a diagram showing dependency of the LED luminance on the conditions of growing the window layer included in the LED device of FIG. 1.

FIG. 9 is a plan view showing another exemplary arrangement of the distribution electrode employed in the LED device of the present invention.

FIG. 10 is a plan view showing still another exemplary arrangement of the distribution electrode employed in the LED device of the present invention.

FIG. 11 is a plan view showing yet another exemplary arrangement of the distribution electrode employed in the LED device of the present invention.

FIG. 12 is a plan view showing a further exemplary arrangement of the distribution electrode employed in the LED device of the present invention.

BEST MODE FOR CARRYING OUT THE INVENTION

Figure 1:
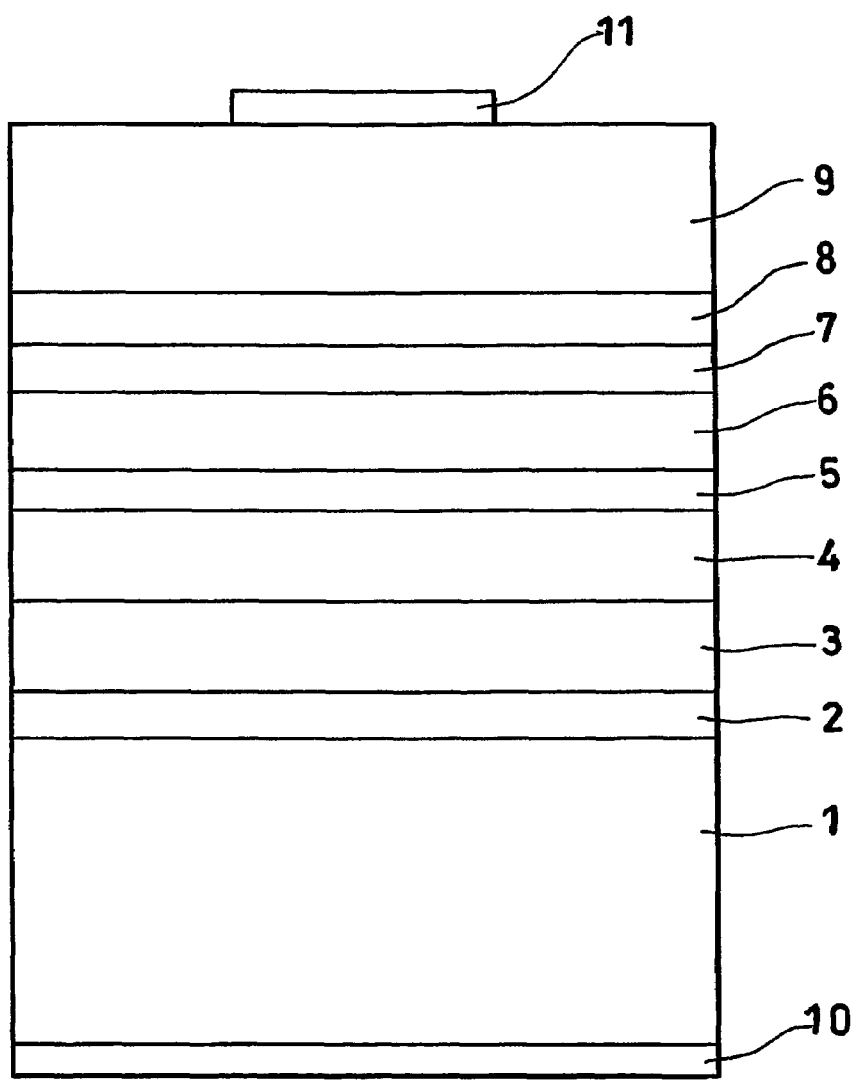
FIG. 1 is a schematic cross section showing one embodiment of a double hetero structure light-emitting diode (LED) device having an AlGaInP active layer according to the present invention.

FIG. 1 is a schematic cross section showing one embodiment of a double hetero structure light-emitting diode (LED) device having an AlGaInP active layer according to the present invention. In this embodiment, on a substrate 1 there are formed a buffer layer 2, a reflection layer 3, an n-type cladding layer 4, a first undoped AlInP layer 5, an active layer 6, a second undoped AlInP layer 7, a p-type intermediate layer 8 and a window layer 9 in this order, with an n-electrode 10 provided on the backside of the substrate 1 and with a p-electrode 11 provided on the front surface of the window layer 9.

The substrate 1 used in this embodiment is a silicon (Si)-doped gallium arsenide (GaAs) substrate (15°-off relative to (100)). On the substrate, the layers listed in Table 1 below are formed by use of trimethylgallium (Ga $(CH_3)_3$), trimethylindium (In$(CH_3)_3$), trimethylaluminum (Al$(CH_3)_3$), dimethylzinc (Zn$(CH_3)_2$), disilane ($Si_2H_6$), arsine ($AsH_3$) and phosphine ($PH_3$). Notably, during film formation AlGaInP layers and AlInP layers are preferably lattice-matched with the GaAs substrate.

TABLE 1

| Layer | Layer thickness (μm) | CV carrier concentration ($cm^{-3}$) | Chemical formula |
|---|---|---|---|
| Window layer | 5≦ | 2 to 4 × $10^{18}$ | p(Zn)—GaP |
| p-Type intermediate layer | 0.5 | 5 to 10 × $10^{17}$ | p(Zn)—$(Al_{0.6}Ga_{0.4})$InP |
| Undoped AlInP layer | 0.5 | — | Undoped AlInP |
| Active layer | 1.0 | — | Undoped AlGaInP |

TABLE 1-continued

| Layer | Layer thickness (μm) | CV carrier concentration (cm$^{-3}$) | Chemical formula |
|---|---|---|---|
| Undoped AlInP layer | 0.2 | — | Undoped AlInP |
| n-Type cladding layer | 1.3 | 0.5 to 3 × 10$^{18}$ | n(Si)—AlInP |
| Reflection layer | 1.0 to 1.5 | 0.5 to 3 × 10$^{18}$ | n(Si—Al$_{0.5}$Ga$_{0.5}$As/Al$_{0.9}$Ga$_{0.1}$As) |
| Buffer layer | 0.5 | 0.5 to 3 × 10$^{18}$ | n(Si)—GaAs |
| Substrate | 280 | — | Si-doped GaAs (15°-off) |

Thus, the general procedure of the production process according to the present invention is as follows.

(1) A silicon-doped n-type GaAs layer serving as the buffer layer 2 is deposited on the GaAs substrate 1 so as to attain a layer thickness of 0.5 μm.

(2) An n-type SiAl$_{0.5}$Ga$_{0.5}$As/Al$_{0.9}$Ga$_{0.1}$As stacked film is provided as the reflection layer 3 (DBR: distributed Bragg reflector). When the reflection layer is not provided, emitted light is attenuated.

(3) On the reflection layer 3, a silicon-doped AlInP layer is provided as the first n-type cladding layer 4.

(4) On the n-type cladding layer 4, an undoped AlInP layer is provided as the first undoped cladding layer 5. The layer 5 preferably has a thickness of 0.1 μm or more. Furthermore, when the layer 5 is not provided, emitted light is attenuated. The n-type cladding layer 4 and the first undoped AlInP layer 5 in combination form the negative-electrode-side cladding layer.

(5) On the first undoped AlInP layer 5, a layer formed of undoped AlGaInP is provided as the active layer 6. The active layer is sandwiched by the first undoped AlInP layer 5 and the second undoped AlInP layer 7 so as to form a double hetero (DH) structure advantageous for light emission.

(6) On the active layer 6, an undoped AlInP layer is provided as the second undoped cladding layer 7. The layer 7 preferably has a thickness of 0.5 μm or more.

Figure 2A:
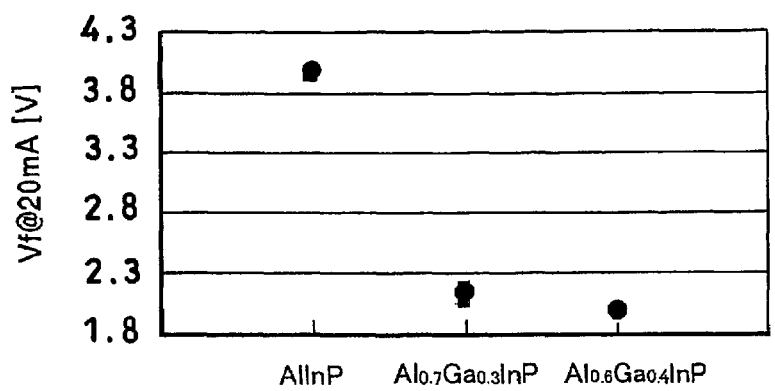
FIG. 2($a$) is a diagram showing dependency of the LED forward voltage (Vf) on the composition of an intermediate layer included in the LED device of FIG. 1.
Figure 2B:
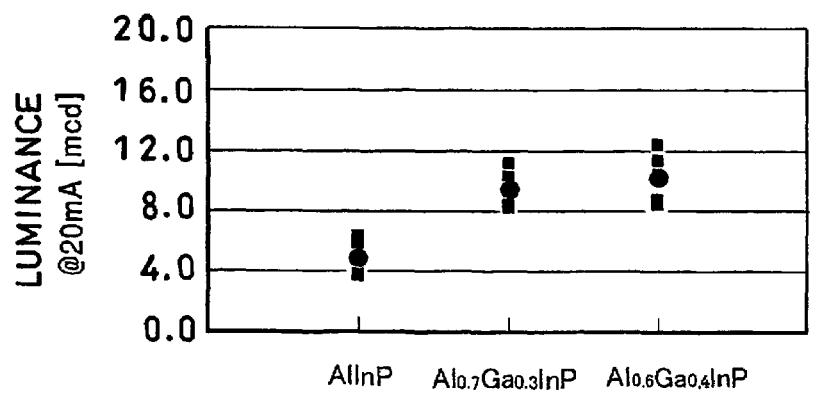

(7) On the second undoped AlInP layer 7, the p-type intermediate layer 8 formed of zinc (Zn)-doped (Al$_{0.6}$Ga$_{0.4}$)InP is formed. The (Al$_{0.6}$Ga$_{0.4}$)InP has an intermediate band gap value falling between the band gap value of GaP and that of AlInP. Therefore, two small, discontinuous band gaps are provided between the window layer 9 and the second undoped AlInP layer 7. Thus, an increase in resistance value caused by the presence of a discontinuous band gap is more effectively prevented, as compared with the case in which one discontinuous band gap is present. The composition of the p-type intermediate layer 8 is not limited to (Al$_{0.6}$Ga$_{0.4}$)InP, and, as shown in FIG. 2 below, (Al$_{0.7}$Ga$_{0.3}$)InP can also be employed so as to emit light. As compared with the case in which AlInP is employed, when the intermediate layer is formed from (Al$_{0.6}$Ga$_{0.4}$)InP or (Al$_{0.7}$Ga$_{0.3}$)InP, forward voltage (Vf) is reduced to about half, and the luminance is approximately doubled. Data shown in Table 2 below are derived from data distribution profiles shown in FIGS. 2(a) and 2(b). Use of (Al$_{0.6}$Ga$_{0.4}$)InP is particularly preferred, since, as compared with the case in which (Al$_{0.7}$Ga$_{0.3}$)InP is employed, Vf is reduced by 0.15 V, and the luminance is increased by 8.5%. The positive-electrode-side cladding layer is formed from a combination of the second undoped AlInP layer 7 and the p-type intermediate layer 8.

TABLE 2

| Sample | Growth conditions | Vf(V@20 mA | Luminance mcd@20 mA | Emission wavelength |
|---|---|---|---|---|
| A | Undoped AlInP | 3.99 | 4.9 | 574 |
| B | pAl$_{0.7}$Ga$_{0.3}$InP | 2.14 | 9.4 | 573 |
| C | pAl$_{0.6}$Ga$_{0.4}$InP | 1.99 | 10.2 | 573 |

Window layer:
Composition: GaP
Thickness = 5 μm
Carrier concentration = 2 × 10$^{18}$ cm$^{-3}$
Undoped AlInP layer:
Layer thickness = 0.5 μm (8) On the p-type intermediate layer 8, the window layer 9 formed of zinc-doped p-type GaP is provided. The layer 9 preferably has a thickness of 5 μm or more. Growth of the layer 9 is preferably performed at 730° C. or higher. The film growth involves doping with zinc. In order to increase the dopant density, a higher growth rate is preferably employed. As described below, the luminance was improved by 70% by growing the layer 9 at 7.8 μm/hour or more.

(9) On the front surface of the window layer 9, the p-electrode 11 is formed, whereas the n-electrode 10 is formed on the backside of the GaAs substrate 1.

The dependency of Vf and luminance on the constitution of the negative-electrode-side cladding layer will next be described. Table 3 shows Vf values and luminance values at various thickness values of the undoped AlInP layer included in the negative-electrode-side cladding layer. As is clear from Table 3, as compared with the case in which the undoped AlInP layer is absent, when an undoped AlInP layer having a thickness of 0.1 μm or 0.2 μm is present, Vf is reduced by about 0.2 V and the luminance is approximately doubled. In addition, as compared with the case in which the AlInP layer has a thickness of 0.1 μm, when the undoped AlInP layer has a thickness of 0.2 μm, the luminance is enhanced by 6%. The data shown in Table 3 are derived from data distribution profiles shown in FIGS. 3(a) and 3(b).

TABLE 3

| Sample | Growth conditions | Vf(V@20 mA | Luminance mcd@20 mA | Emission wavelength |
|---|---|---|---|---|
| D | No undoped AlInP layer | 2.32 | 5.1 | 573 |
| E | Undoped AlInP layer (0.1 μm) | 2.13 | 10.8 | 574 |
| F | Undoped AlInP layer (0.2 μm) | 2.14 | 11.5 | 573 |

Growth temperature:
n-Type cladding layer (7) = 700° C.,

TABLE 3-continued

| Sample | Growth conditions | Vf(V@20 mA) | Luminance mcd@20 mA | Emission wavelength |
|---|---|---|---|---|

Figure 4A:
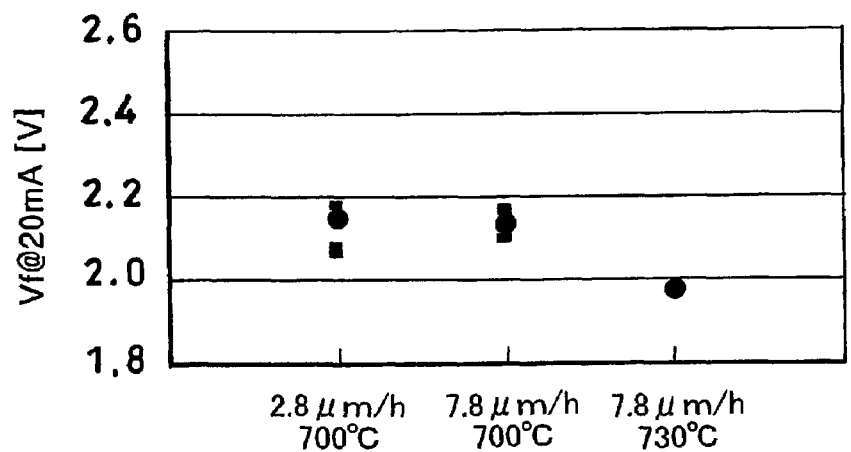
FIG. 4($a$) is a diagram showing dependency of the LED Vf on the conditions of growing a window layer included in the LED device of FIG. 1.
Figure 4B:
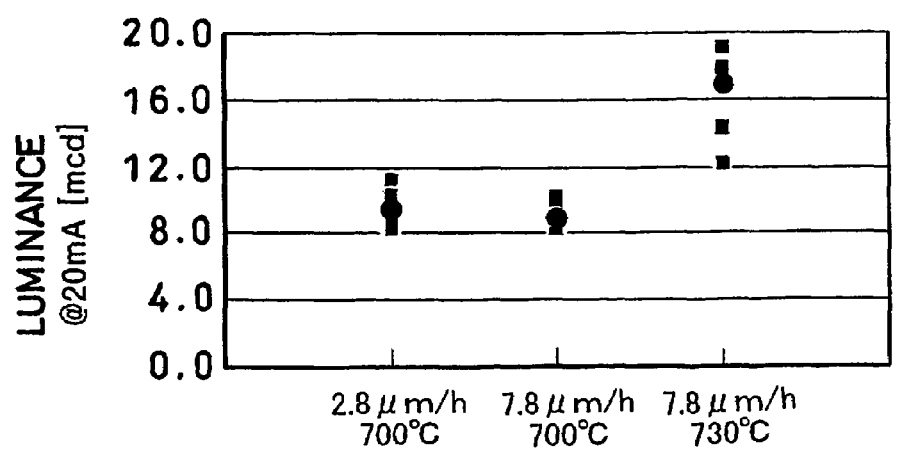

Undoped AlInP layers (6, 4) & active layer (5) = 730° C.,
p-Type intermediate layer (3) = 700° C.
p-Type intermediate layer (3):
Composition = $Al_{0.7}Ga_{0.3}InP$
Thickness = 0.5 μm
Carrier concentration = $7 \times 10^{17}$ cm$^{-3}$
Positive-electrode-side undoped AlInP layer:
Thickness = 5 μm
Window layer:
Composition = GaP
Thickness = 5 μm
Carrier concentration = $2.5 \times 10^{18}$ cm$^{-3}$ Next, the dependency of Vf and luminance on the window layer growth conditions will be described. Table 4 shows Vf values and luminance values at various window layer growth temperatures. As is clear from Table 4, as compared with the case of the growth at 700° C. and at a growth rate of 2.8/μm/hour, when the growth is performed at 700° C. and at a growth rate of 7.8 μm/hour, approximately the same Vf and luminance values are obtained. However, when the growth is performed at 730° C. and at a growth rate of 7.8 μm/hour, the Vf is reduced by the amount of about 0.16 V, and the luminance is enhanced by 88%. In this case, the negative-electrode-side undoped AlInP layer has a thickness of 0.2 μm, and, as calculated from the data shown in Table 3, the effect of the difference in thickness accounts for 6%. Even when this effect is disregarded, the luminance is enhanced by 80% or more. The data shown in Table 4 are derived from data distribution profiles shown in FIGS. 4(a) and 4(b).

TABLE 4

| Sample | Growth conditions | Vf(V@20 mA) | Luminance mcd@20 mA | Emission wavelength |
|---|---|---|---|---|
| G | GaP, 700° C., 2.8 μm/h | 2.14 | 9.4 | 573 |
| H | GaP, 700° C. 7.8 μm/h | 2.14 | 9.0 | 573 |
| I | GaP, 730° C. 7.8 μm/h | 1.98 | 16.9 | 573 |

Growth temperature:
n-Type cladding layer (7) = 700° C.,
Undoped AlInP layers (6, 4) & active layer (5) = 730° C.,
p-Type intermediate layer (3) = 700° C.
p-Type intermediate layer (3):
Composition = $Al_{0.7}Ga_{0.3}InP$
Thickness = 0.5 μm
Carrier concentration = $7 \times 10^{17}$ cm$^{-3}$
Window layer:
Composition = GaP
Thickness = 5 μm
Carrier concentration = $2.5 \times 10^{18}$ cm$^{-3}$ A light-emitting diode device of the present invention provided with a distribution electrode that is in contact with a portion of the surface of the window layer will -be described with reference to FIGS. 5 to 12.

Figure 5:
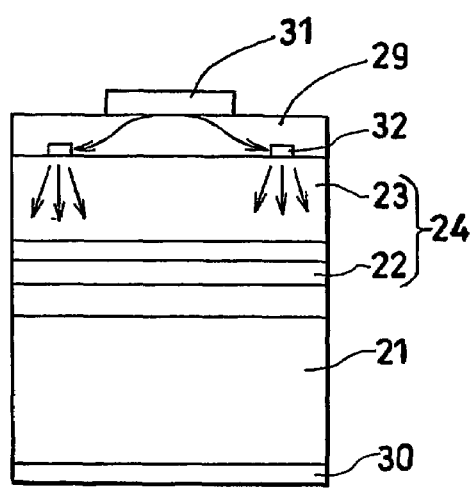
FIG. 5 is a schematic cross section showing the configuration of another LED device of the present invention provided with a distribution electrode in ohmic contact with a portion of the surface of the window layer.
Figure 6:
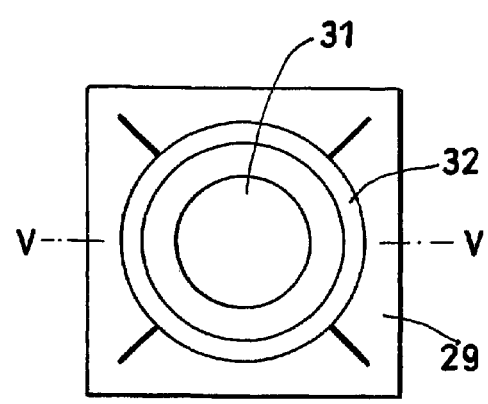
FIG. 6 is a schematic plan view showing the LED device of FIG. 5.

FIGS. 5 and 6 schematically show the configuration of a light-emitting diode device of the present invention. FIG. 6 is a plan view of the device, and FIG. 5 is a cross section of the device of FIG. 6, as taken along line V-V. The expression "the surface of a semiconductor layer when viewed from above" as used herein refers to the case where the surface is viewed in a plan view as shown in FIG. 6.

As shown in these figures, the light-emitting diode device of the present invention comprises a semiconductor substrate 21 having on its rear surface a first electrode 30, a semiconductor layer 24 formed on the semiconductor substrate 21 and including a light-emitting section 22 formed of AlInGaP and a window layer 23 formed atop the light-emitting section, a distribution electrode 32 formed to extend along a portion of the surface of the window layer 23 (semiconductor layer 24) and kept in ohmic contact with the window layer 23, a transparent, electrically conductive film 29 formed to cover the surface of the window layer 23 and the distribution electrode 32 and establishing electrical conduction with the distribution electrode 32, and a pad electrode 31 formed on a portion of the surface of the electrically conductive film 29 and establishing electrical conduction with the electrically conductive film 29. Preferably, the light-emitting section 22 has a structure that exhibits high emission efficiency, such as a known double hetero structure or a known multiple quantum well (MQW) structure. As shown in FIG. 6, preferably, the distribution electrode 32 is provided on a portion of the surface of the semiconductor layer 24, which portion does not overlap with the pad electrode 31 when viewed from above. More preferably, the distribution electrode 32 is not provided on a portion that overlaps with the pad electrode 31. Since good ohmic contact is maintained between the distribution electrode 32 and the window layer 23, the electrical resistance between them becomes low. In contrast, since sufficient ohmic contact is not established between the transparent, electrically conductive film 29 and the window layer 23, the electrical resistance between them becomes high.

In the light-emitting diode device having the aforementioned configuration, the distribution electrode 32 is provided on a portion of the surface of the window layer 23 and is kept in ohmic contact with the window layer 23. Therefore, the electrical resistance between the distribution electrode 32 and the window layer 23 becomes much lower than that between the transparent, electrically conductive film 29 and the window 23, and, as shown by arrows in FIG. 5, most of driving current supplied from the pad electrode 31 flows through a path exhibiting lower electrical resistance, successively to the transparent, electrically conductive film 29, distribution electrode 32, window layer 23 and light-emitting section 22. Since the current which has flowed from the distribution electrode 32 to the window layer 23 is appropriately diffused in the window layer 23, light is emitted from a portion of the light-emitting section 22, which portion corresponds to a portion located around the distribution electrode 32. Therefore, only a small amount of the light emitted from the light-emitting section 22 is intercepted by means of the distribution electrode 32, and most of the emitted light can be extracted from the upper portion of the light-emitting diode device, whereby emission efficiency can be improved.

Regardless of its conduction type (n-type or p-type), the window layer 23 contributes to improvement of emission efficiency. In general, a p-type window layer exhibits low mobility, and difficulty is encountered in diffusing current from the distribution electrode 32 in the layer. However, the present inventors have found that, when a p-type window layer satisfies specific requirements and when factors including the thickness of the layer, the product of the thickness and carrier concentration of the layer, the surface carrier concentration of the layer and the material of the layer are optimized, the resultant layer greatly contributes to attainment of high-luminance emission.

Specifically, the present inventors have found that when the window layer 23 is of p-type conductivity, if the layer has a thickness of 3 μm or more, a sufficient amount of current diffuses in the layer. However, when the thickness of the layer is excessively large, surface conditions of the layer are impaired. Therefore, the thickness of the layer is preferably 20 μm or less. More preferably, the thickness of the layer is 10 μm or less, from the viewpoint of cost reduction.

The present inventors have also found that the product of the thickness and carrier concentration of the window layer 23 is a very important factor in attaining high-luminance emission, and, when the product is $5 \times 10^{14}$ cm$^{-2}$ or more, the layer greatly exhibits the effect of attaining high-luminance emission.

When the surface carrier concentration of the window layer 23 is $1 \times 10^{18}$ cm$^{-3}$ or more, contact resistance between the layer 23 and the distribution electrode 32 is lowered, leading to promotion of current diffusion and attainment of high-luminance emission.

The material of the window layer 23 is preferably a material capable of transmitting emission and diffusing a sufficient amount of current. For example, GaP is an optimal material for forming the window layer, since a GaP layer can be grown through metal-organic chemical vapor deposition (MOCVD), and lowering of the resistance of a GaP layer and thickening of the layer are readily attained.

As shown in FIG. 6, the distribution electrode 32 is formed of a substantially circular loop electrode so as to surround the pad electrode 31. The loop electrode includes portions that extend radially. The width of the loop electrode is preferably 20 μm or less. Such planar arrangement of the distribution electrode 32 enables current to be diffused more effectively in the window layer 23, and thus, driving current from the pad electrode 31 can be spread over a wide area of the surface of the window layer 23.

As described above, the distribution electrode 32 is provided so as not to overlap with the pad electrode 31. Therefore, only a small amount of light is emitted in a region directly below the pad electrode 31, and most of the emitted light is not intercepted by the pad electrode 31 and can be extracted from the upper portion of the light-emitting diode device, leading to considerable improvement of emission efficiency and attainment of high-luminance emission.

When the area of the distribution electrode 32 is regulated to be smaller than that of the pad electrode 31, emission can be more efficiently extracted to the outside of the device, as compared with the case of a conventional light-emitting diode device; i.e., emission efficiency can be further improved.

As described above, the electrical resistance between the distribution electrode 32 and the semiconductor layer 24 becomes low by virtue of ohmic contact between the electrode 32 and the layer 24. Therefore, an increase in the forward voltage of the light-emitting diode device can be suppressed, whereby lifetime characteristics of the device can be improved.

The transparent, electrically conductive film 29 is formed of, for example, indium tin oxide (ITO), and exhibits excellent translucency. Particularly when the film is formed through sputtering, the resultant film exhibits excellent characteristics (i.e., low resistance and high transmittance). Therefore, substantially none of the light emitted from the light-emitting section 22 is absorbed in the transparent, electrically conductive film 29 when the emitted light passes therethrough, and thus the emitted light can be efficiently extracted from the upper portion of the light-emitting diode device through the transparent, electrically conductive film 29.

The pad electrode 31 is an electrode that is to be subjected to wire-bonding for connecting the light-emitting diode device to an external electric circuit, and therefore the electrode 31 must have a certain area. In the case of a conventional light-emitting diode device, light emitted by means of the driving current flowing from a pad electrode 31 to a region directly below the pad electrode 31 is intercepted by the electrode 31 and fails to be extracted to the outside of the device. Therefore, some measures have conventionally been taken. For example, an insulating layer has been provided between the pad electrode 31 and a light-emitting section 22 to thereby forcibly prevent flow of the driving current from the pad electrode 31 to the region directly below the electrode 31. In contrast, in the present invention, the driving current can be induced to flow through the distribution electrode 32. Accordingly, with a more simplified configuration having no insulating layer, the driving current can be prevented from flowing to the region directly below the pad electrode 31.

The area of a region of the surface of the transparent, electrically conductive film 29 (or the surface of the semiconductor layer 24), which region becomes effective during emission of light (effective emission region), is obtained by subtracting, from the area of the surface of the film 29, the area of the surface of the pad electrode 31 (i.e., the area as measured when viewed in a plan view as shown in FIG. 6). Hereinafter, the resultant area will be referred to as the effective emission area S. Extraction of emitted light is obstructed by means of the pad electrode 31 in a region directly below the electrode, and such a phenomenon occurs to some extent even in the case of the distribution electrode 32. Therefore, in the present invention, preferably, the total surface area (i.e., the area as measured when viewed from above) of the distribution electrode 32 is regulated to 3% to 30% inclusive, of the effective emission area S so as to prevent occurrence of problems caused by excessive obstruction of extraction of emitted light, which would occur in the case where the surface area of the distribution electrode 32 is excessively large, or problems caused by an increase in the forward voltage (Vf), which would occur in the case where the surface area of the electrode 32 is excessively small.

A phenomenon that extraction of emitted light is obstructed by means of the distribution electrode 32 in a region directly below the electrode 32 is less likely to occur when current is well diffused in the window layer 22 in an appropriate manner.

Next will be described more specific embodiments of the semiconductor light-emitting device of the present invention with reference to FIGS. 7 through 12.

Figure 7:
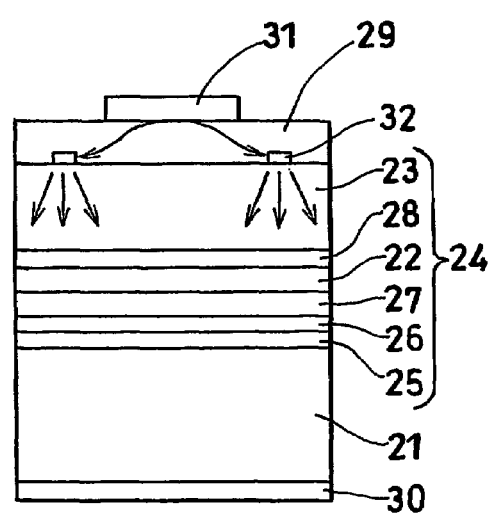
FIG. 7 is a schematic cross section showing the configuration of a modification of the LED device of FIG. 5.
Figure 8:
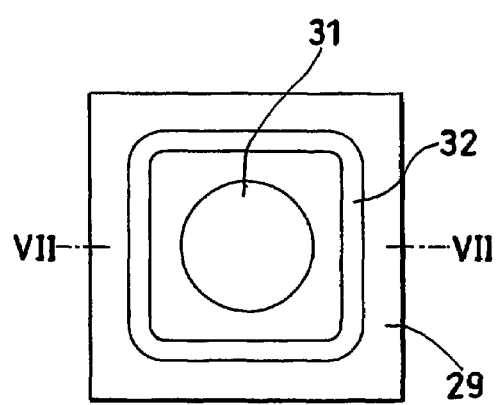
FIG. 8 is a schematic plan view showing the LED device of FIG. 7.

FIGS. 7 and 8 show a modification of the light-emitting diode device of the present invention shown in FIG. 5. FIG. 8 is a plan view of the device, and FIG. 7 is a cross-sectional view of the device of FIG. 8, as taken along line VII-VII. The light-emitting diode device of the present invention shown in these figures emits yellowish-green light.

A semiconductor layer 24 is formed on a Si-doped n-type 15°-off (001) GaAs single-crystal substrate 21. The semiconductor layer 24 includes a buffer layer 25 formed of Si-doped n-type GaAs, a DBR reflection layer 26 formed of a Si-doped n-type $Al_{0.5}Ga_{0.5}As/Al_{0.9}Ga_{0.1}As$ multi-layer film, a lower cladding layer 27 formed of a Si-doped n-type $Al_{0.5}In_{0.5}P$ layer and an undoped $Al_{0.5}In_{0.5}P$ layer, a light-emitting layer 22 formed of an undoped AlGaInP mixed crystal whose compositional proportions have been regulated so as to attain an emission wavelength of 570 nm, an upper cladding layer 28 formed of an undoped $Al_{0.5}In_{0.5}P$ layer and a Zn-doped p-type. $Al_{0.5}Ga_{0.5}P$ layer, and a Zn-doped p-type GaP window layer 23, the layers being successively formed in that order on the substrate 21.

Each of the layers 25, 26, 27, 22, 28 and 23 which constitute the semiconductor layer 24 was formed atop the substrate 21 by means of reduced-pressure MOCVD by use of trimethylaluminum (($CH_3)_3Al$), trimethylgallium (($CH_3)_3Ga$)

and trimethylindium (($CH_3$)$_3$In) serving as raw materials for Group-III constituent elements. Diethylzinc (($C_2H_5$)$_2$Zn) was employed as a zinc (Zn) doping raw material. Disilane ($Si_2H_6$) was employed as an n-type doping raw material. Furthermore, phosphine ($PH_3$) or arsine ($AsH_3$) was employed as a raw material for a Group-V element. Each of the layers 25, 26, 27, 22, 28 and 23 was formed at a temperature of 735° C.

The carrier concentration and thickness of the buffer layer 25 were regulated to about $2\times10^{18}$ cm$^{-3}$ and about 0.5 μm, respectively. The carrier concentration and thickness of the reflection layer 26 were regulated to about $2\times10^{18}$ cm$^{-3}$ and about 1.2 μm, respectively. The carrier concentration of the lower cladding layer 27 was regulated to about $1\times10^{18}$ cm$^{-3}$. In the layer 27, the thicknesses of the Si-doped n-type layer and the undoped layer formed thereon were regulated to about 1.3 μm and 0.2 μm, respectively. The thickness of the light-emitting layer 22 was regulated to about 1 μm. In the upper cladding layer 28, the thicknesses of the undoped layer and the Zn-doped p-type layer formed thereon were regulated to 0.5 μm and about 0.5 μm, respectively. The carrier concentration of the Zn-doped p-type layer was regulated to about $6\times10^{17}$ cm$^{-3}$.

The carrier concentration and thickness of the p-type widow layer 23 were regulated to about $3\times10^{18}$ cm$^{-3}$ and about 6 μm, respectively. The product of the carrier concentration N and thickness d of the window layer 23; i.e., N.d, was found to be about $1.8\times10^{15}$ cm$^{-2}$.

The lower cladding layer 27, the light-emitting layer 22 and the upper cladding layer 28 constitute a light-emitting section of the light-emitting diode device. Thus, the light-emitting section has a double hetero structure formed of AlGaInP.

In the light-emitting diode device, in order to form a distribution electrode 32, firstly, a gold beryllium alloy (Au (99 wt. %)-Be (1 wt. %) alloy) film (thickness: about 50 nm) was temporarily deposited onto the entire surface of the window layer 23 by means of a generally employed vacuum deposition technique, and subsequently a gold (Au) film (thickness: about 100 nm) was deposited onto the surface of the gold beryllium alloy film.

Subsequently, the thus formed double-layer film including the gold beryllium alloy film (first film) and the gold film (second film) was subjected to patterning by means of a generally employed photolithography technique, to thereby form a distribution electrode 32 having a substantially square frame shape (width: about 6 μm, size of each side: 150 μm). The area of the distribution electrode 32 was found to be about $0.36\times10^{-4}$ cm$^{-2}$. As shown in FIG. 8, the distribution electrode 32 including the first and second films is formed on a region (other than a region directly below a pad electrode 31) of the surface of the window layer 23 such that the electrode 32 surrounds the pad electrode 31. When viewed from above, the distribution electrode 32 assumes a symmetrical, substantially square shape.

On the rear surface of the single-crystal substrate 21, a gold germanium alloy layer (thickness: about 0.3 μm) was formed, and a gold layer (thickness: about 0.3 μm) was formed thereon to thereby form an n-type ohmic electrode 30. Thereafter, the resultant product was subjected to alloying-thermal treatment under a nitrogen stream at 450° C. for 10 minutes to thereby establish ohmic contact between the distribution electrode 32 and the window 23 and ohmic contact between the n-type ohmic electrode 30 and the single-crystal substrate 21.

Subsequently, an indium tin oxide (ITO) transparent, electrically conductive film 29 was deposited onto the surface of the window layer 23 and the distribution electrode 32 by means of a known magnetron sputtering technique. The specific resistance and thickness of the transparent, electrically conductive film 29 were regulated to about $4\times10^{-4}$ Ω cm and about 500 nm, respectively. The film 29 exhibits a transmittance of about 95% with respect to emission wavelength; i.e., the film exhibits good characteristics.

A multi-layer film including a Cr layer (thickness: 30 nm) and a gold layer (thickness: 1 μm) was formed on the transparent, electrically conductive film 29 by means of a known magnetron sputtering technique. After a generally employed organic photoresist material was applied to the multi-layer film, a region where the pad electrode 31 was to be provided was subjected to patterning by means of a known photolithography technique to thereby form the circular pad electrode 31 having a diameter of about 110 μm. The surface area of the pad electrode 31 was found to be about $1\times10^{-4}$ cm$^2$.

As shown in the plan view of FIG. 8, the region where the pad electrode 31 is to be provided is determined so as to include the center of the surface of the light-emitting diode device; i.e., to include the intersection of the diagonals of the square surface of the device, for the following reason. In the case where the pad electrode 31 is provided on the center region of the surface of the light-emitting diode device, current tends to uniformly flow throughout the light-emitting diode device, and inclination of the device chip tends not to occur when the pad electrode 31 is subjected to wire-bonding.

Thereafter, the above-formed product was cut into chips by means of a generally employed dicing technique to thereby produce the square light-emitting diode device (size: 230 μm×230 μm). The surface area of the transparent, electrically conductive film 29 was found to be about $4\times10^{-4}$ cm$^2$, and the effective emission area S, which is obtained by subtracting the surface area of the pad electrode 31 from the surface area of the transparent, electrically conductive film 29, was calculated to be about $3\times10^{-4}$ cm$^2$. The total surface area of the distribution electrode 32 was found to be about $0.36\times10^{-4}$ cm$^2$, and the ratio of the total surface area to the effective emission area S was calculated to be about 12%.

When forward current was caused to flow through the ohmic electrode 30 and the pad electrode 31 of the above formed light-emitting diode device, yellowish-green light (wavelength: about 570 nm) was emitted through the surface of the transparent, electrically conductive film 29. When a current of 20 mA was caused to flow, the forward voltage (Vf: with respect to 20 mA) became about 2 V by virtue of good ohmic characteristics of the distribution electrode 32 and the current diffusion effect of the window layer 23.

By virtue of the effect of the ohmic distribution electrode 32 provided on a peripheral region of the light-emitting diode device, as well as the effect of the window 23, emission of light was observed at the peripheral region of the light-emitting diode device, and the intensity of light emitted from the device chip, which is measured in a simple manner, was found to be about 40 mcd. Since driving current was diffused uniformly throughout the device by virtue of the presence of the distribution electrode 32 and the window layer 23, light of substantially uniform intensity was emitted through any portion of the surface of the transparent, electrically conductive film 29.

In the first embodiment described above, Zn or Si is employed as a dopant. However, even when a known dopant, such as Mg, Te or Se, is employed, effects similar to those described above can be obtained. In the first embodiment, a double hetero structure is applied to the light-emitting layer 22. However, even when the light-emitting layer 22 has an MQW structure, effects similar to those described above can be obtained.

As described above, in the light-emitting diode device of the first embodiment, the thickness and carrier concentration of the window layer 23 are about 6 μm and about $3\times10^{18}$ cm$^{-3}$, respectively, and the product of the carrier concentration N and thickness d of the layer 23; i.e., N.d, is about $1.8\times10^{15}$ cm$^{-2}$. The light-emitting diode device was regarded as the light-emitting diode device of Example 1. The procedure of Example 1 (the first embodiment) was repeated, except that the thickness and carrier concentration of the window layer were changed as shown in Table 5, to thereby produce five types of light-emitting diode devices (Examples 2, 3, 4, 5 and 6). The Vf value and emission intensity of each of the light-emitting diode devices of Examples 1 through 6 were measured. The results are shown in Table 5 below.

TABLE 5

| Window layer | | | Characteristics | | |
|---|---|---|---|---|---|
| Thickness (μm) | Carrier concentration (cm$^{-3}$) | N · d (cm$^{-2}$) | Luminance (mcd) | Vf(V)@20 mA | |
| 6 | 3.0E+18 | 1.8E+15 | 40 | 1.99 | Ex. 1 |
| 3 | 3.0E+18 | 9E+14 | 33 | 2.02 | Ex. 2 |
| 10 | 3.0E+18 | 3E+15 | 42 | 1.99 | Ex. 3 |
| 6 | 1.0E+18 | 6E+14 | 32 | 2.02 | Ex. 4 |
| 10 | 1.0E+18 | 1E+15 | 39 | 1.99 | Ex. 5 |
| 10 | 5.0E+17 | 5E+14 | 30 | 2.02 | Ex. 6 |
| — | — | — | 12 | 2.24 | Comp. Ex. |

A light-emitting diode device having the same configuration as that of the device of Example 1, except that no window layer is provided, was produced for comparison. The Vf value and emission intensity of the thus produced comparative device were compared with those of each of the light-emitting diode devices of Examples 1 through 6. The results are shown in Table 5 above.

As shown in Table 5, the Vf value (with respect to 20 mA) of the light-emitting diode device of the Comparative Example is about 2.2 V, which is higher than the Vf value of the respective light-emitting diode devices of Examples 1 through 6; i.e., 1.99 V to 2.02 V. In the device of the Comparative Example, emission of light occurred merely in a region directly below the ohmic electrode and a region around the electrode, and thus a large amount of the emitted light was intercepted by the electrode and failed to be extracted to the outside of the device. As a result, the comparative device emitted light of low luminance; i.e., light having a luminance of less than 15 mcd. In contrast, the respective devices of Examples 1 through 6 emitted light having a luminance of 30 mcd to 42 mcd.

Comparison between the device of the Comparative Example and the devices of the Examples reveals that the light-emitting diode device of the present invention emits light of high luminance while maintaining its Vf at a low level.

FIGS. 9 through 12 are plan views showing other exemplary arrangements of the distribution electrode. In the embodiments described above, the continuous loop distribution electrode is provided so as to surround the pad electrode. However, as shown in FIG. 9, the distribution electrode 32 may be formed of separate individual loop electrodes that are arranged around the pad electrode 31. As shown in FIG. 10, the distribution electrode 32 may assume a linear combination of loop electrodes. As shown in FIG. 11, the distribution electrode 32 may be formed of a lattice arrangement of loop electrodes. As shown in FIG. 12, the distribution electrode 32 may be formed of a combination of a loop electrode and separate individual electrodes.

As described above, the distribution electrode 32 may be formed of individually dispersed electrodes, a continuous belt or loop electrode, or planar electrode(s).

In the case where the distribution electrode 32 is formed of a continuous belt or loop electrode, the electrode may assume any shape, such as a square, rectangular, circular, elliptic or polygonal shape. Meanwhile, in the case where the distribution electrode 7 is formed of individually dispersed electrodes, the dispersed electrodes may assume any pattern, such as a radial, circular or spiral pattern.

A distribution electrode, a transparent, electrically conductive film and a pad electrode were formed on the window layer of the device shown as Sample I in Table 4 under the conditions of Example 1. The Vf, luminance and emission wavelength were measured under the same conditions as those for Sample I. The results are shown in Table 6 below as Example 7. Luminance enhancement and Vf reduction of Example 7 could be conspicuously confirmed as compared with Sample I.

TABLE 6

| | Luminance (mcd) | Wavelength (nm) | Vf (V) |
|---|---|---|---|
| Example 7 | 51 | 573 | 1.94 |

Figure 13:
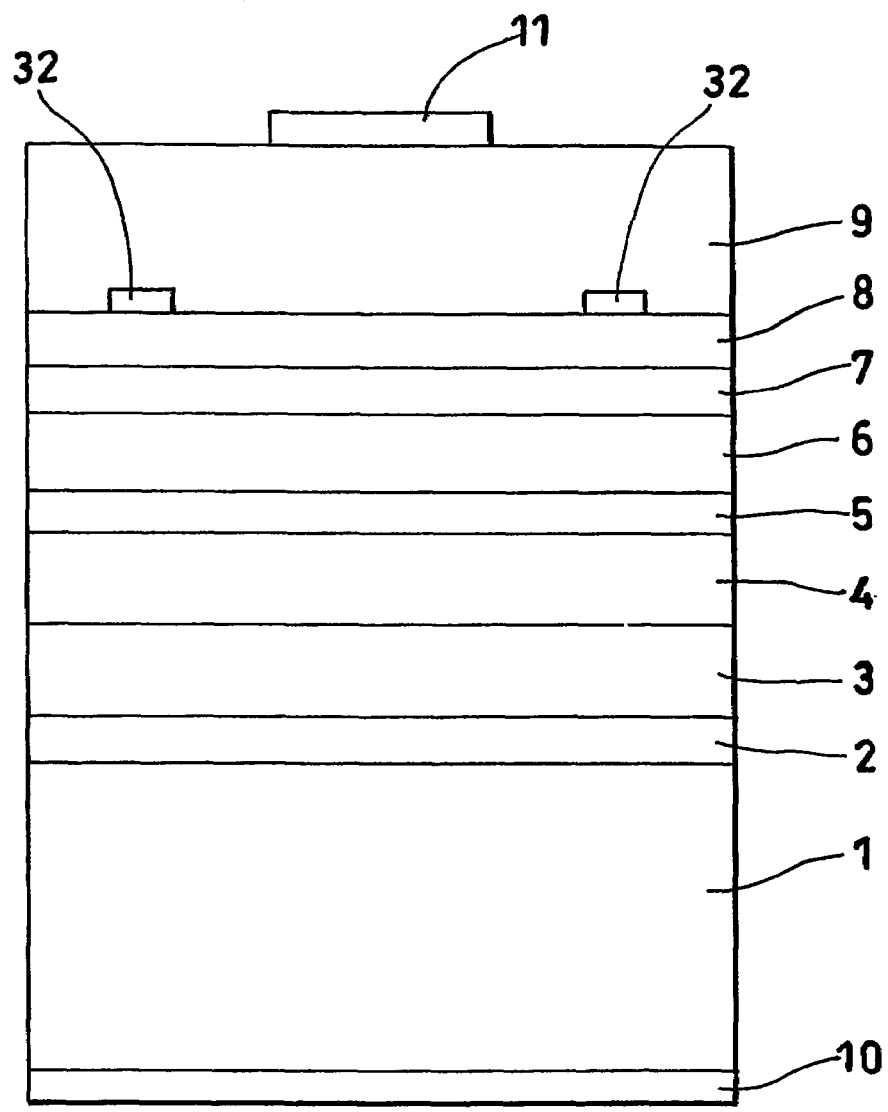
FIG. 13 is a schematic cross section showing the configuration of a light-emitting diode device according to the present invention that has an AlGaInP active layer and a window layer provided with a distribution electrode.
Figure 14:
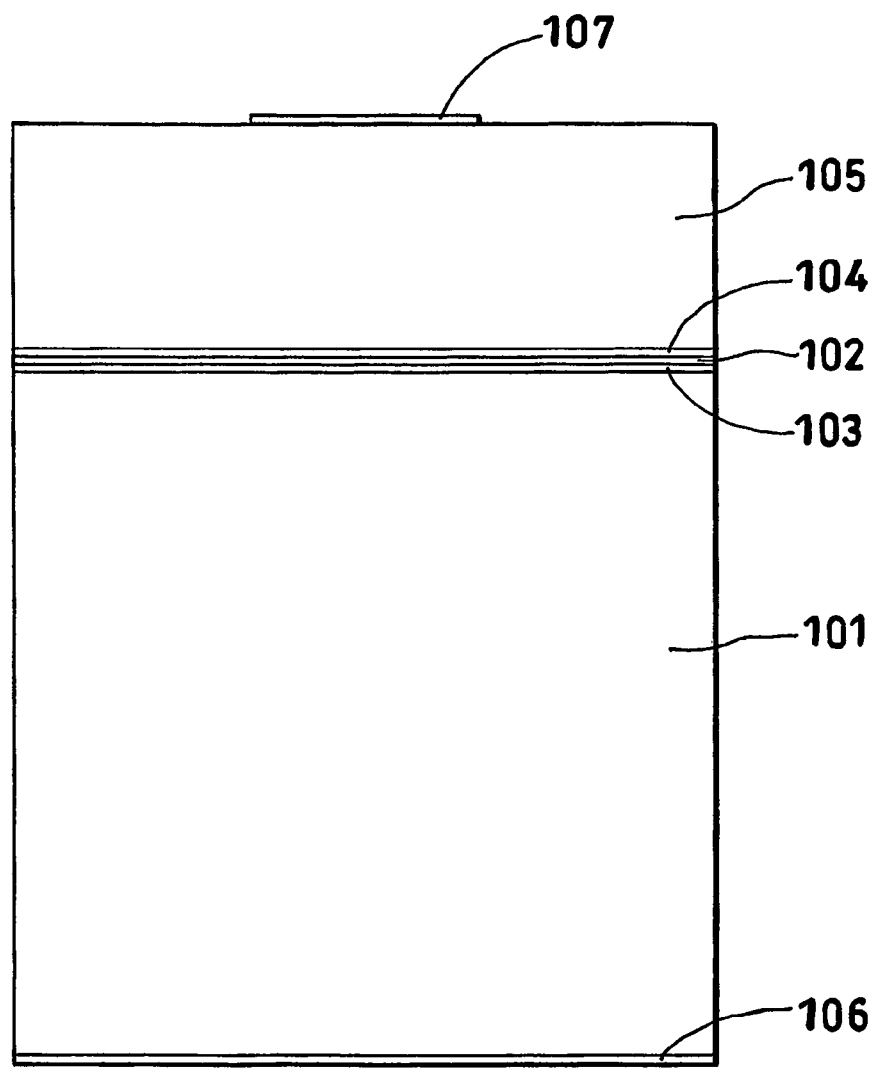
FIG. 14 is a schematic cross section showing a first conventional LED example.
Figure 15:
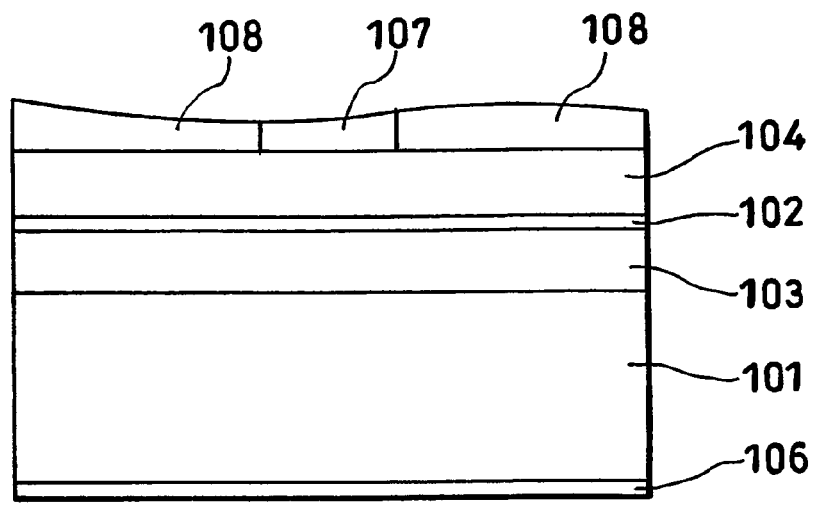
FIG. 15 is a schematic cross section showing a second conventional LED example.
Figure 16:
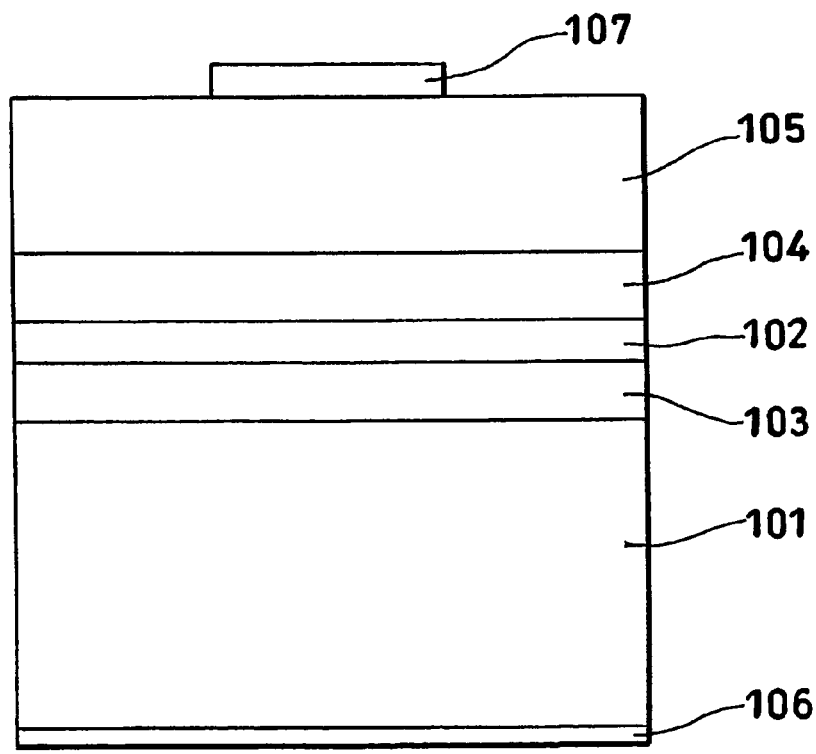
FIG. 16 is a schematic cross section showing a third conventional LED example.
Figure 17:
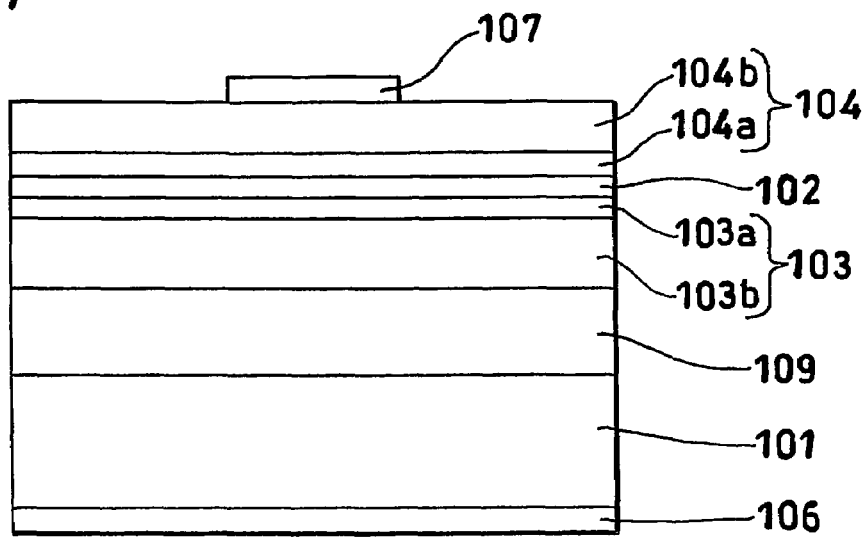
FIG. 17 is a schematic cross section showing a fourth conventional LED example.
Figure 18:
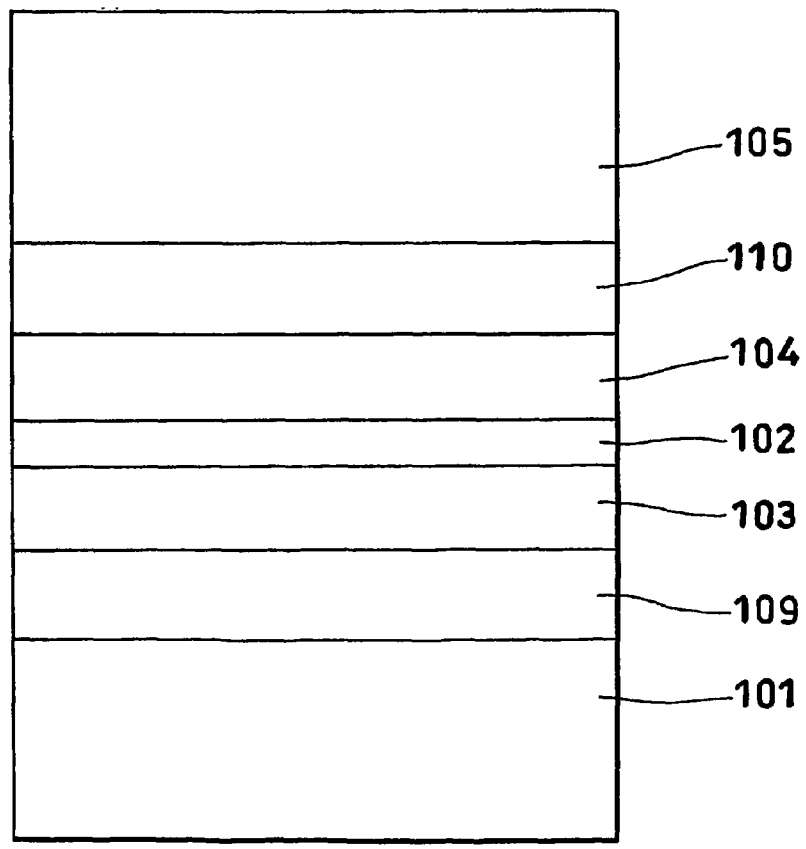
FIG. 18 is a schematic cross section showing a fifth conventional LED example.
Figure 19:
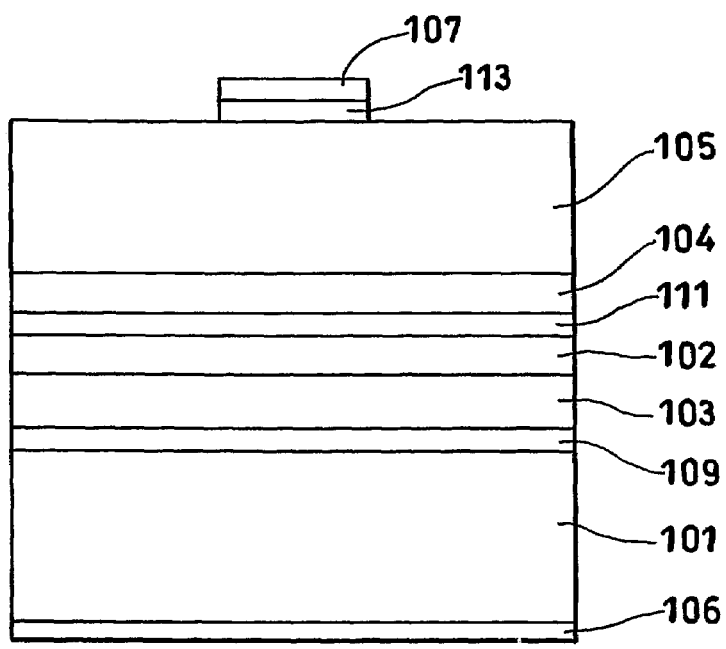
FIG. 19 is a schematic cross section showing a sixth conventional LED example.
Figure 20:
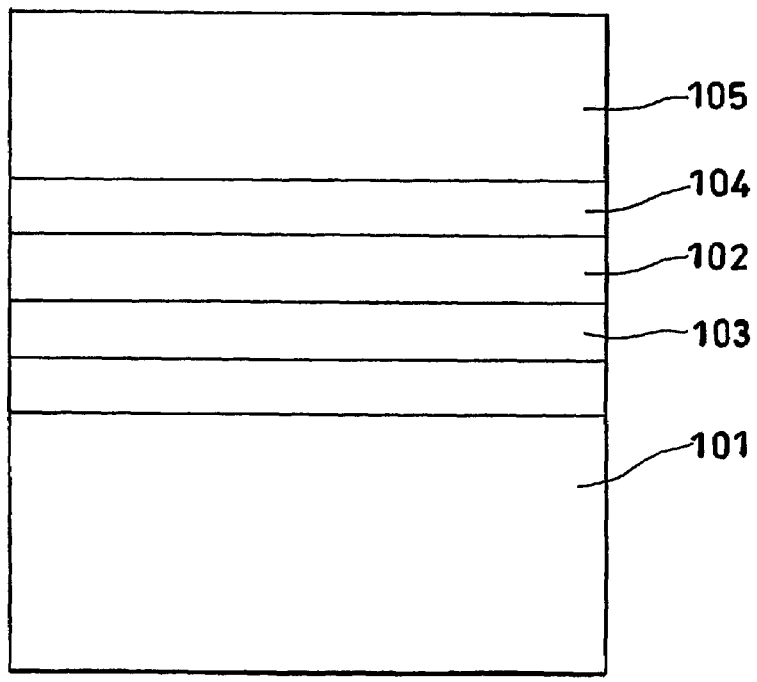
FIG. 20 is a schematic cross section showing a seventh conventional LED example.

Moreover, the present invention includes a double hetero-structure light-emitting diode device having an active layer 6 of AlGaInP as shown in FIG. 13, in which a window layer 9 of the device is provided therein with a distribution electrode 32. With this configuration, is obtain a light-emitting diode device improved in crystallinity of the window layer, enhanced in luminance and improved in emission efficiency.

INDUSTRIAL APPLICABILITY

According to the aforementioned constitution of the present invention, the effects that can be provided are described below.

In the double hetero-structure light-emitting diode device of the present invention having an AlGaInP active layer, as described above, the positive-electrode-side cladding layer comprises an undoped AlInP layer grown to have a thickness of 0.5 μm or more and kept in contact with the active layer, and an intermediate layer doped to assume p-type conductivity, kept in contact with the window layer and having an intermediate energy band gap value falling between the energy band gap value of the undoped AlInP layer and that of the window layer. Thus, Vf can be reduced to half, and the luminance can be approximately doubled.

By growing the window layer at high temperature the crystallinity of the window layer is enhanced, and the growth is performed at high speed while performing doping. Through such a procedure, Vf can be reduced by about 0.16 V, and the luminance can be enhanced by 80% or more.

By providing an undoped layer on the active layer side of the negative-electrode-side cladding layer, Vf can be reduced by about 0.2 V, and the luminance can be approximately doubled.

By using silicon as a dopant of the negative-electrode-side semiconductor layer, problems that would otherwise be caused by an increase in process temperature can be prevented. In fact, no such problems have occurred.

Also, in the light-emitting diode device of the present invention, the distribution electrode is provided on a portion of the surface of the window layer and is kept in ohmic contact with the window layer. Therefore, the electrical resistance between the distribution electrode and the window layer becomes much lower than that between the transparent, electrically conductive film and the window layer, and most of driving current supplied from the pad electrode flows, through a path exhibiting lower electrical resistance, successively to the transparent, electrically conductive film, distribution electrode, window layer and light-emitting section. Since the current that has flowed from the distribution electrode to the window layer is appropriately diffused in the window layer, light is emitted from a portion of the light-emitting section, which portion corresponds to a portion located around the distribution electrode. Therefore, only a small amount of the light emitted from the light-emitting section is intercepted by means of the distribution electrode, and most of the emitted light can be extracted from the upper portion of the light-emitting diode device, whereby emission efficiency can be improved.

In the case where the window layer is of p-type conductivity, the thickness of the layer is determined to be 3 μm or more, and therefore a sufficient amount of current diffuses in the layer.

In the case where the window layer is of p-type conductivity, the product of the thickness and carrier concentration of the layer is determined to be $5 \times 10^{14}$ cm$^{-2}$ or more, and therefore the layer effectively contributes to attainment of high-luminance emission.

In the case where the window layer is of p-type conductivity, the surface carrier concentration of the layer is determined to be $1 \times 10^{18}$ cm$^{-3}$ or more, and therefore contact resistance between the layer and the distribution electrode is lowered, leading to promotion of current diffusion and attainment of high-luminance emission.

Since the window layer is formed of p-type GaP containing Zn or Mg as an impurity, the layer is translucent against emission and can diffuse a sufficient amount of current therein. In addition, lowering of the resistance of the window layer and thickening of the layer, as well as optimization of the layer, are readily attained.

The invention claimed is:

1. A light-emitting diode device comprising:
   an AlGaInP active layer (6);
   a positive-electrode-side cladding layer (7,8) and a negative-electrode-side cladding layer (4,5) which sandwich the active layer and have an energy band gap value greater than an energy band gap value of the active layer; and
   a window layer (9) which is formed on the positive-electrode-side cladding layer and has an energy band gap value greater than that of the active layer;
   wherein the positive-electrode-side cladding layer comprises an undoped AlInP layer (7) grown to have a thickness of 0.5 μm or more and kept in contact with the active layer, and an intermediate layer (8) doped to assume p-type conductivity, kept in contact with the window layer and having an intermediate energy band gap value between an energy band gap value of the undoped AlInP layer and that of the window layer.

2. The light-emitting diode device according to claim 1, further comprising:
   a distribution electrode (32) formed on a portion of a surface of the window layer and in ohmic contact with the window layer;
   a transparent, electrically conductive film (29) formed to cover the surface of the window layer and the distribution electrode and establish electrical conduction with the distribution electrode; and
   a pad electrode (31) formed on a portion of a surface of the transparent, electrically conductive film to establish electrical conduction with the electrically conductive film.

3. The light-emitting diode device according to claim 2, wherein the window layer has a thickness of at least 3 μm.

4. The light-emitting diode device according to claim 2, wherein the window layer has a thickness and a carrier concentration, a product of which is at least $5 \times 10^{14}$ cm$^{-2}$.

5. The light-emitting diode device according to claim 2, wherein the window layer has a surface carrier concentration of at least $1 \times 10^{18}$ cm$^{-3}$.

6. The light-emitting diode device according to claim 2, wherein the distribution electrode is formed on a surface of the semiconductor layer so as not to overlap with the pad electrode when viewed from above.

7. The light-emitting diode device according to claim 2, wherein the distribution electrode is smaller in area than the pad electrode.

8. The light-emitting diode device according to claim 2, wherein the distribution electrode has a total surface area accounting for 3% or more, but 30% or less of an effective emission area.

9. The light-emitting diode device according to claim 2, wherein the distribution electrode is formed of a gold alloy.

10. The light-emitting diode device according to claim 2, wherein the transparent, electrically conductive film is formed of indium tin oxide.

11. The light-emitting diode device according to claim 2, wherein the pad electrode is formed on a center of a surface of the device when viewed from above.

12. The light-emitting diode device according to claim 2, wherein the pad electrode has a surface formed of gold.

13. The light-emitting diode device according to claim 2, wherein the pad electrode is formed of a multi-layer film that has a layer in contact with the transparent and electrically conductive film, formed of chromium.

14. The light-emitting diode device according to claim 2, wherein the distribution electrode is formed of a loop electrode having a substantially quadrangular or substantially circular shape to surround the pad electrode.

15. The light-emitting diode device according to claim 2, wherein the distribution electrode is a loop electrode having a width of 20 μm or less.

16. A light-emitting diode device comprising:
   an AlGaInP active layer (6);
   a positive-electrode-side cladding layer (7,8) and a negative-electrode-side cladding layer (4,5) which sandwich the active layer and have an energy band gap value greater than an energy band gap value of the active layer; and
   a window layer (9) which is formed on the positive-electrode-side cladding layer and has an energy band gap value greater than that of the active layer;
   wherein the window layer is a GaP layer grown at 730° C. or higher and at a growth rate of 7.8 μm/hour or more in the presence of Zn serving as a dopant.

17. The light-emitting diode device according to claim 16, wherein, the positive-electrode-side cladding layer comprises an undoped AlInP layer (7) grown to have a thickness of 0.5 μm or more and kept in contact with the active layer, and an intermediate layer (8) doped to assume p-type conductivity, kept in contact with the window layer and having an intermediate energy band gap value between an energy band gap value of the undoped AlInP layer and that of the window layer.

18. A light-emitting diode device comprising:
an AlGaInP active layer (6);
a positive-electrode-side cladding layer (7,8) and a negative-electrode-side cladding layer (4,5) which sandwich the active layer and have an energy band gap value greater than an energy band gap value of the active layer; and
a window layer which is formed on the positive-electrode-side cladding layer and has an energy band gap value greater than that of the active layer;
wherein the negative-electrode-side cladding layer comprises an undoped AlInP layer (5) kept in contact with the active layer and having a thickness of 0.1 μm or more.

19. The light-emitting diode device according to claim 18, wherein the negative-electrode-side cladding layer comprises an n-type cladding layer (4) kept in contact with a negative-electrode side of the undoped AlInP layer and containing silicon serving as a dopant.

20. A method for producing a light-emitting diode device comprising: an AlGaInP active layer (6); a positive-electrode-side cladding layer (7,8) including a second undoped AlInP layer (7) and a p-type intermediate layer (8) and a negative-electrode-side cladding layer (4,5) including a silicon-doped n-type cladding layer (4) and a first undoped AlInP layer (5) which sandwich the active layer and have an energy band gap value greater than an energy band gap value of the active layer; and
a zinc-doped p-type GaP window layer (9) which is formed on the positive-electrode-side cladding layer and has an energy band gap value greater than that of the active layer;
wherein the positive-electrode-side cladding layer comprises the second undoped AlInP layer (7) grown to have a thickness of 0.5 μm or more and kept in contact with the active layer, and the p-type intermediate layer (8) doped to assume p-type conductivity, kept in contact with the window layer and having an intermediate energy band gap value between an energy band gap value of the second undoped AlInP layer and that of the window layer, said method comprising the steps of: depositing a buffer layer (2) on a gallium arsenide substrate (1); providing an n-type reflection layer (3) on the buffer layer; depositing the silicon-doped n-type cladding layer (4) on the reflection layer; providing the first undoped AlInP layer (5) on the n-type cladding layer; providing the AlGaInP active layer (6) on the first undoped AlInP layer; providing the second undoped AlInP layer (7) on the active layer; providing the p-type intermediate layer (8) on the second undoped AlInP layer and growing on the p-type intermediate layer the zinc-doped p-type GaP window layer (9), at 730° C. or higher and at a growth rate of 7.8 μ/hour or more.

21. A light-emitting diode device comprising
a semiconductor substrate (21) having on its rear surface a first electrode (30);
a semiconductor layer (24) formed on the semiconductor substrate and including a light-emitting section (22) formed of AlInGaP and a window layer (23) formed atop the light-emitting section;
a distribution electrode (32) formed to extend along a portion of a surface of the window layer and kept in ohmic contact with the window layer;
a transparent, electrically conductive film (29) formed to cover the surface of the window layer and the distribution electrode and establishing electrical conduction with the distribution electrode; and
a pad electrode (31) formed on a portion of a surface of the transparent, electrically conductive film and establishing electrical conduction with the electrically conductive film,
wherein the window layer has a thickness of at least 3 μm,
wherein the window layer has a thickness and a carrier concentration, a product of which is at least $5 \times 10^{14}$ cm$^{-2}$,
wherein the window layer has a surface carrier concentration of at least $1 \times 10^{18}$ cm$^{-3}$, and
wherein the window layer is formed of a p-type GaP layer containing Zn or Mg as an impurity.

22. The light-emitting diode device according to claim 21, wherein the semiconductor substrate is of n-type conductivity, and the window layer is of p-type conductivity.

23. The light-emitting diode device according to claim 21, wherein the distribution electrode is formed on a surface of the semiconductor layer so as not to overlap with the pad electrode when viewed from above.

24. The light-emitting diode device according to claim 21, wherein the distribution electrode is smaller in area than the pad electrode.

25. The light-emitting diode device according to claim 21, wherein the distribution electrode has a total surface area accounting for 3% or more, but 30% or less of an effective emission area.

26. The light-emitting diode device according to claim 21, wherein the distribution electrode is formed of a gold alloy.

27. The light-emitting diode device according to claim 21, wherein the transparent, electrically conductive film is formed of indium tin oxide.

28. The light-emitting diode device according to claim 21, wherein the pad electrode is formed on a center of a surface of the device when viewed from above.

29. The light-emitting diode device according to claim 21, wherein the pad electrode has a surface formed of gold.

30. The light-emitting diode device according to claim 21, wherein the pad electrode is formed of a multi-layer film that has a layer in contact with the transparent and electrically conductive film, formed of chromium.

31. The light-emitting diode device according to claim 21, wherein the distribution electrode is formed of a loop electrode having a substantially quadrangular or substantially circular shape to surround the pad electrode.

32. The light-emitting diode device according to claim 21, wherein the distribution electrode is a loop electrode having a width of 20 μm or less.

33. A method for producing a light-emitting diode device comprising a semiconductor single-crystal substrate (21) having on its rear surface a first electrode (30);
a semiconductor layer (24) formed on the semiconductor substrate and including a light-emitting section (22) formed of AlInGaP and a p-type window layer (23) formed atop the light-emitting section;

a distribution electrode (32) formed to extend along a portion of a surface of the window layer and kept in ohmic contact with the window layer;

a transparent, electrically conductive film (29) formed to cover the surface of the window layer and the distribution electrode and establishing electrical conduction with the distribution electrode; and a pad electrode (31) formed on a portion of a surface of the transparent, electrically conductive film and establishing electrical conduction with the electrically conductive film, wherein the window layer has a thickness of at least 3 μm, wherein the window layer has a thickness and a carrier concentration, a product of which is at least $5 \times 10^{14}$ $cm^{-2}$, wherein the window layer has a surface carrier concentration of at least $1 \times 10^{18}$ $cm^{-3}$, and wherein the window layer is formed of a p-type GaP layer containing Zn or Mg as an impurity, said method comprising the steps of:

epitaxially growing on the semiconductor single-crystal substrate (21) the semiconductor layer (24) including the light-emitting section (22) formed of AlInGaP and the p-type window layer (23) atop the light-emitting section;

forming the distribution electrode (32) on a portion of a surface of the window layer and in ohmic contact with the window layer;

forming the transparent, electrically conductive film (29) to cover the surface of the window layer and the distribution electrode and establish electrical conduction with the distribution electrode; and forming the pad electrode (31) on a portion of a surface of the transparent, electrically conductive film to establish electrical conduction with the electrically conductive film.

34. The method according to claim 33, wherein the semiconductor layer is formed through metal-organic chemical vapor deposition.

35. The method according to claim 33, wherein the transparent, electrically conductive film is formed through sputtering.

36. The method according to claim 33, wherein the pad electrode is formed through sputtering.

* * * * *